United States Patent [19]
Tran

[11] Patent Number: 5,550,777
[45] Date of Patent: Aug. 27, 1996

[54] HIGH SPEED, LOW POWER CLOCKING SENSE AMPLIFIER

[75] Inventor: Hiep V. Tran, Dallas, Tex.

[73] Assignee: Texas Instruments Incorporated, Dallas, Tex.

[21] Appl. No.: 346,725

[22] Filed: Nov. 30, 1994

[51] Int. Cl.$^6$ .................................................. G11C 7/06
[52] U.S. Cl. .................... 365/205; 365/203; 365/202; 365/196; 365/204
[58] Field of Search ............................. 365/63, 205, 207, 365/203, 202, 196, 204; 307/530

[56] References Cited

U.S. PATENT DOCUMENTS

| 4,991,141 | 2/1991 | Tran | 365/207 |
|---|---|---|---|
| 5,029,136 | 7/1991 | Tran et al. | 365/205 |
| 5,289,430 | 2/1994 | Tran | 365/230.08 |
| 5,294,847 | 3/1994 | Grossman et al. | 307/530 |
| 5,418,737 | 5/1995 | Tran | 365/63 |

*Primary Examiner*—Viet Q. Nguyen
*Attorney, Agent, or Firm*—Carlton H. Hoel; W. James Brady, III; Richard L. Donaldson

[57] ABSTRACT

A memory element for a static random access memory which comprises a bit line and a bit line for providing a voltage on one of the lines indicative of a binary "1" or a "0" and the other of a "1" or a "0" on the other line. A sense amplifier is coupled to the bit and bit lines, the sense amplifier including a first switch coupled to the bit line and a second switch coupled to the bit line. The element also includes circuitry associated with the bit line and responsive to a select signal to indicate the voltage level of the bit line and to indicate the voltage level of the bit line. The first and second switches are responsive to the circuitry to turn off one of said first and second switches and turn on the other of said first and second switches when the difference in voltage level on the bit and bit lines is in one direction and to turn off and on the other of the switches when the difference in voltage level on the bit and bit lines is in the opposite direction. The circuitry comprises a first series circuit coupled between the bit line and a source of reference voltage comprising a the first switch having a first control element, a second switch having a third control element and a fourth switch having a fourth control element and a second series circuit coupled between the bit line and the source of reference voltage comprising the second switch having a second control element, a fifth switch having a fifth control element and a sixth switch having a sixth control element.

19 Claims, 1 Drawing Sheet

HIGH SPEED CLOCKING SENSE AMP

HIGH SPEED, LOW POWER CLOCKING SENSE AMPLIFIER

BACKGROUND OF THE INVENTION

1. Field of the Invention

This invention relates to sense amplifiers for use in memory circuits and more specifically, in static random access memory (SRAM) circuits.

2. Brief Description of the Prior Art

In memory circuits, especially those wherein the sense amplifier has a cross coupled circuit connection between the bit and $\overline{\text{bit}}$ lines, the sense amplifier is always connected to the bit lines. In SRAM primarily, it is necessary to disconnect the sense amplifier from the bit line during sensing the difference between a one and a zero on the bit line for performance reasons. This sensing generally takes place after the precharge portion of a clock cycle which has a precharge portion and a data sensing portion.

In the prior art, this problem has been resolved by using a switching device, e.g. a transistor, in the cross coupling circuitry to isolate the sense amplifier from the bit line, the switching device receiving a signal after precharge and before sensing to turn off the switching device and provide the required isolation. This procedure requires the existence of a transistor and control circuitry therefor. In addition, a time interval is required from the end of precharge to the commencement of bit line sensing to insure that the switch has been opened or turned off prior to a high speed seitching action in the sense amplifier, this causing a slowdown in the operation of the memory circuit. Still further, timing becomes critical to insure that sensing does not take place too soon or too late in respect to the switch transistor turn off. It is apparent that circuitry which could eliminate the need for such a switch could diminish the amount of circuitry required as well as provide an increase in speed or circuit response. Also, circuitry which would minimize the criticality of precise timing would also result in a diminution of erroneous results.

SUMMARY OF THE INVENTION

In accordance with the present invention, there is provided a sense amplifier wherein, after precharge is completed, a select signal, which signifies the end of precharge, isolates the precharge line from the memory element and connects a selected memory element to one of the bit and $\overline{\text{bit}}$ lines while isolating the memory element from the other of the bit and $\overline{\text{bit}}$ lines.

Briefly, the above is accomplished by providing a memory element for a static random access memory which comprises a bit line and a $\overline{\text{bit}}$ line for providing a voltage on one of the lines indicative of a binary "1" or a "0" and the other of a "1" or a "0" on the other line. A sense amplifier is coupled to the bit and $\overline{\text{bit}}$ lines, the sense amplifier including a first switch coupled to the bit line and a second switch coupled to the $\overline{\text{bit}}$ line. The element also includes circuitry associated with the bit line and responsive to a select signal to indicate the voltage level of the bit line and to indicate the voltage level of the $\overline{\text{bit}}$ line. The first and second switches are responsive to the circuitry to turn off one of said first and second switches and turn on the other of said first and second switches when the difference in voltage level on the bit and $\overline{\text{bit}}$ lines is in one direction and to turn off and on the other of the switches when the difference in voltage level on the bit and $\overline{\text{bit}}$ lines is in the opposite direction. The circuitry comprises a first series circuit coupled between the bit line and a source of reference voltage comprising a the first switch having a first control element, a second switch having a third control element and a fourth switch having a fourth control element and a second series circuit coupled between the $\overline{\text{bit}}$ line and the source of reference voltage comprising the second switch having a second control element, a fifth switch having a fifth control element and a sixth switch having a sixth control element.

It can be seen that, in accordance with the present invention, the requirement for precharging of the prior art can be eliminated and that the voltages on the bit and $\overline{\text{bit}}$ lines are isolated from each other and the sense amplifier during sampling with the isolation resulting directly from the difference in voltage on the bit and $\overline{\text{bit}}$ lines and not from an external signal and external circuitry required to perform such isolation.

DESCRIPTION OF THE PREFERRED EMBODIMENT

Figure 1:
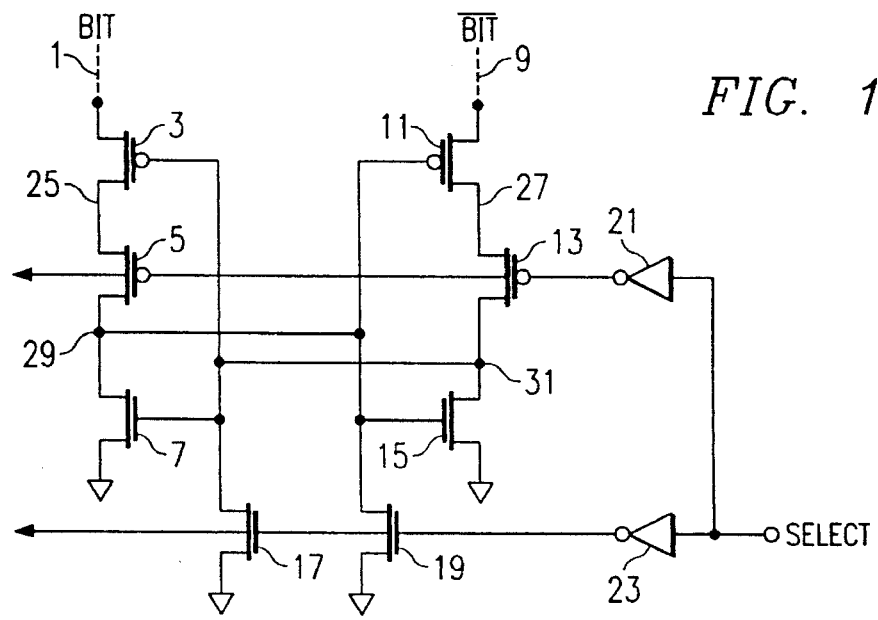
FIG. 1 is a circuit diagram of a simplified SRAM memory element with a sense amplifier in accordance with the present invention.

Referring now to FIG. 1, there is shown an SRAM memory sensing element which includes a bit line 1 coupled $V_{cc}$ via a pull up device (not shown) to ground via the series circuit of a p-channel switch transistor 3, a p-channel transistor 5 and an n-channel transistor 7. A $\overline{\text{bit}}$ line 9 is coupled to $V_{cc}$ via a pull up device (not shown) to ground via the series circuit of a p-channel transistor 11, a p-channel transistor 13 and an n-channel transistor 15. A precharge signal source is coupled through n-channel transistor 17 to the gates of transistors 3 and 7 and the junction of transistors 13 and 15 which is node 29. The precharge signal source is also coupled through n-channel transistor 19 to the gates of transistors 11 and 15 and the junction of transistors 5 and 7 which is node 31. The bit line 1 and $\overline{\text{bit}}$ line 9 will each always have a positive voltage thereon, the line representing a "1" having a higher voltage thereon so that there is a discernible difference in voltage therebetween.

When the select signal goes low, a high voltage is provided at the outputs of inverters 21 and 23, thereby turning on n-channel transistors 17 and 19 and providing a low voltage at the gates of n-channel transistors 3 and 7 to turn on transistor 3 with transistor 5 being off and providing a low voltage at the gates of n-channel transistors 11 and 15 with transistor 13 being off. This means that the potential at node 25 is essentially that of bit line and the potential at node 27 is essentially that of $\overline{\text{bit}}$ line 9. One of nodes 25 and 27 will have a higher voltage than the other, depending upon whether the bit line 1 or $\overline{\text{bit}}$ line 9 is high at that time. When the select line now goes high, the outputs of inverters 21 and 23 are low, thereby turning on the p-channel transistors 5 and 13 and turning of the transistors 17 and 19 to remove the precharge voltage from the sensing element. This essentially carries the voltage at nodes 25 and 27 down to nodes 29 and 31 respectively. The voltage at node 25 is now fed back to the gates of transistors 11 and 15 and the voltage at node 27 is fed back to the gates of transistors 3 and 7.

Assuming bit line 1 to be high and $\overline{\text{bit}}$ line 9 to be lower, node 29 will be high relative to node 31. This causes transistor 11 to turn off and causes transistor 3 to be turned on harder. The effect is that the voltage at node 29 will increase whereas the voltage at node 31 will decrease due to this feedback, thereby isolating the $\overline{\text{bit}}$ line 9 from the memory element and turning on transistor 15 to place ground potential at node 31 while transistor 7 remains off due to the low voltage at node 31. At this time there is a distinct difference in voltage between nodes 29 and 31 due to the above described circuit action. No current can flow to node 31 from the $\overline{\text{bit}}$ line 9 whereas node 31 has a true ground thereon due to transistor 15 being turned on. The outputs of the memory element are taken from nodes 29 and 31. It can also be seen that bit and $\overline{\text{bit}}$ lines remain at $V_{cc}$ voltage after sensing and there is no necessity to precharge the bit lines.

Figure 2:
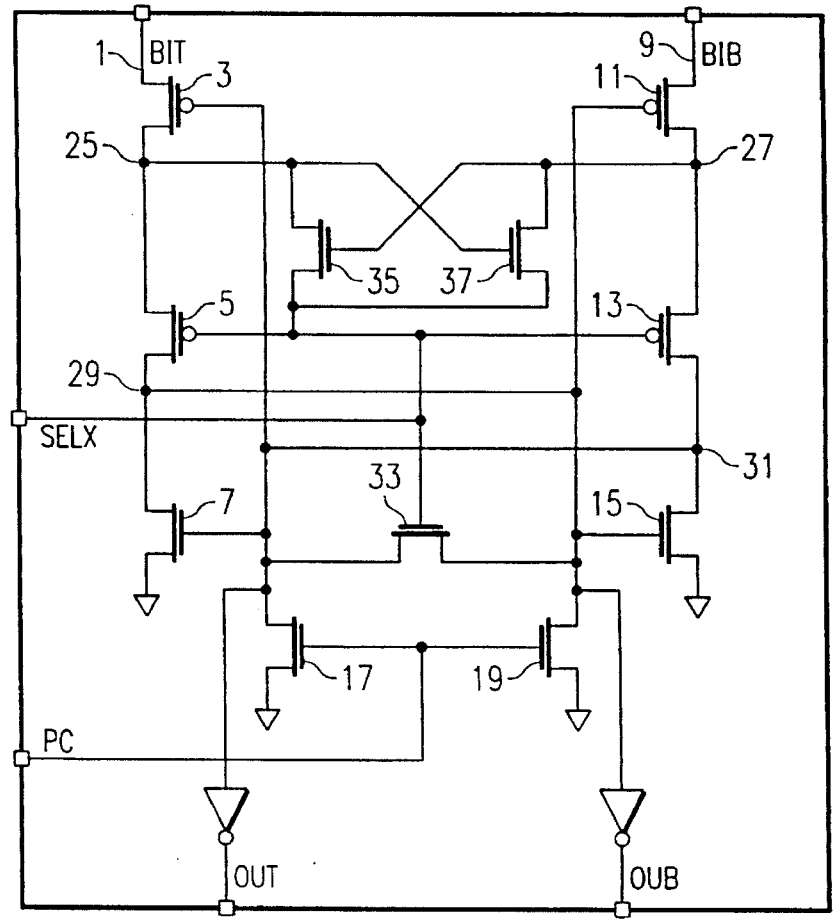
FIG. 2 is a circuit diagram of a second embodiment of an SRAM utilizing the sense amplifier of the present invention.

Referring now to FIG. 2, there is shown a second embodiment of an SRAM memory element wherein like numbers represent the same components as in FIG. 1. The embodiment of FIG. 2 is identical to that of FIG. 1 with the addition of n-channel transistor 33 coupled across the sources of transistors 17 and 18 and controlled by the select signal and a pair of cross coupled transistors 35 and 37 coupled across nodes 25 and 27 to provide amplification of the signal between nodes 25 and 27 in addition to the amplification provided by the cross coupled amplifier of the signal add nodes 29 and 31. The purpose of transistor 33 is to provide a short circuit between the output nodes 29 and 31 at commencement of the select operation to insure that the nodes 29 and 31 are at the same voltage before these nodes commence charge up during the select operation. When the select signal is high, nodes 29 and 31 are essentially short circuited to each other. When the select signal goes low, the nodes 29 and 31 are isolated from each other land the p-channel transistors 3 and 11 are turned on with further operation continuing as explained above with reference to FIG. 1. In addition, as can be seen, the control of the transistors 17 and 19 is provided by a separate precharge signal rather than by the select signal. The select signal and precharge signal can be taken from the same source, as shown in FIG. 1, rather than be separately generated signals.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A memory element for a static random access memory which comprises:
  (a) a bit line for providing a voltage thereon indicative of a "1" or a "0" and a $\overline{\text{bit}}$ line for providing a voltage thereon indicative of the complement of said "1" or "0" on said bit line; and
  (b) a sense amplifier coupled to said bit and $\overline{\text{bit}}$ lines, said sense amplifier including:
    (i) a first switch coupled to said $\overline{\text{bit}}$ line;
    (ii) a second switch coupled to said $\overline{\text{bit}}$ line;
    (iii) circuitry associated with said bit line and responsive to a predetermined signal to indicate the voltage level of said bit line and associated with said $\overline{\text{bit}}$ line and responsive to said predetermined signal to indicate the voltage level of said $\overline{\text{bit}}$ line;
    (iv) said first and second switches responsive to said circuitry to turn off a predetermined one of said first and second switches and turn on the other of said first and second switches in response to the difference in voltage level on said bit and $\overline{\text{bit}}$ lines.

2. The memory element of claim 1 wherein said circuitry comprises a first series circuit coupled between said bit line and a source of reference voltage comprising, serially, said first switch having a first control element, a third switch having a third control element and a fourth switch having a fourth control element and a second series circuit coupled between said $\overline{\text{bit}}$ line and said source of reference voltage comprising, serially, said second switch having a second control element, a fifth switch having a fifth control element and a sixth switch having a sixth control element.

3. The memory element of claim 1 wherein said first and second switches are p-channel transistors.

4. The memory element of claim 2 wherein said first and second switches are p-channel transistors.

5. The memory element of claim 2 wherein said third and fifth switches are p-channel transistors and said fourth and sixth switches are n-channel transistors.

6. The memory element of claim 4 wherein said third and fifth switches are p-channel transistors and said fourth and sixth switches are n-channel transistors.

7. The memory element of claim 2 further including a switch responsive to a second predetermined signal which precedes said predetermined signal to condition said first and second switches to close, said predetermined signal causing said third and fifth switches to close and providing the voltage at the junction of said third and fourth switches at said second control element and providing the voltage at the junction of said fifth and sixth switches at said first control element.

8. The memory element of claim 4 further including a switch responsive to a second predetermined signal which precedes said predetermined signal to condition said first and second switches to close, said predetermined signal causing said third and fifth switches to close and providing the voltage at the junction of said third and fourth switches at said second control element and providing the voltage at the junction of said fifth and sixth switches at said first control element.

9. The memory element of claim 6 further including a switch responsive to a second predetermined signal which precedes said predetermined signal to condition said first and second switches to close, said predetermined signal causing said third and fifth switches to close and providing the voltage at the junction of said third and fourth switches at said second control element and providing the voltage at the junction of said fifth and sixth switches at said first control element.

10. A sense amplifier which includes:
  (a) a first switch for coupling to a bit line;
  (b) a second switch for coupling to a $\overline{\text{bit}}$ line; and
  (c) circuitry associated with said bit line and responsive to a predetermined signal to indicate the voltage level of said bit line and associated with said $\overline{\text{bit}}$ line and responsive to said predetermined signal to indicate the voltage level of said $\overline{\text{bit}}$ line;
    (iv) said first and second switches responsive to said circuitry to turn off a predetermined one of said first and second switches and turn on the other of said first and second switches in response to the difference in voltage level on said bit and $\overline{\text{bit}}$ lines.

11. The amplifier of claim 10 wherein said circuitry comprises a first series circuit coupled between said bit line and a source of reference voltage comprising, serially, said first switch having a first control element, a third switch having a third control element and a fourth switch having a fourth control element and a second series circuit coupled between said $\overline{\text{bit}}$ line and said source of reference voltage comprising, serially, said second switch having a second control element, a fifth switch having a fifth control element and a sixth switch having a sixth control element.

12. The amplifier of claim 10 wherein said first and second switches are p-channel transistors.

13. The amplifier of claim 11 wherein said first and second switches are p-channel transistors.

14. The amplifier of claim 11 wherein said third and fifth switches are p-channel transistors and said fourth and sixth switches are n-channel transistors.

15. The amplifier of claim 13 wherein said third and fifth switches are p-channel transistors and said fourth and sixth switches are n-channel transistors.

16. The memory element of claim 11 further including a switch responsive to a second predetermined signal which precedes said predetermined signal to condition said first and second switches to close, said predetermined signal causing said third and fifth switches to close and providing the voltage at the junction of said third and fourth switches at said second control element and providing the voltage at the junction of said fifth and sixth switches at said first control element.

17. The memory element of claim 13 further including a switch responsive to a second predetermined signal which precedes said predetermined signal to condition said first and second switches to close, said predetermined signal causing said third and fifth switches to close and providing the voltage at the junction of said third and fourth switches at said second control element and providing the voltage at the junction of said fifth and sixth switches at said first control element.

18. The memory element of claim 15 further including a switch responsive to a second predetermined signal which precedes said predetermined signal to condition said first and second switches to close, said predetermined signal causing said third and fifth switches to close and providing the voltage at the junction of said third and fourth switches at said second control element and providing the voltage at the junction of said fifth and sixth switches at said first control element.

19. A sense amplifier which includes:

(a) a first switch for coupling to a bit line;

(b) a second switch for coupling to a $\overline{\text{bit}}$ line;

(c) means for opening said first and second switches; and (d) circuitry responsive to a voltage difference on one of said bit and $\overline{\text{bit}}$ lines relative to the other line after opening of said first and second switches for causing one of said switches to close and the other of said switches to continue opening.

* * * * *